United States Patent
Kim et al.

(10) Patent No.: US 10,403,684 B2
(45) Date of Patent: Sep. 3, 2019

(54) DISPLAY DEVICE

(71) Applicant: LG DISPLAY CO., LTD., Seoul (KR)

(72) Inventors: Eunah Kim, Asan-si (KR); Sangcheon Youn, Seoul (KR); Saemleenuri Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/394,124

(22) Filed: Dec. 29, 2016

(65) Prior Publication Data

US 2018/0061906 A1    Mar. 1, 2018

(30) Foreign Application Priority Data

Aug. 26, 2016    (KR) ...................... 10-2016-0109133

(51) Int. Cl.
*H01L 27/32*      (2006.01)
*H01L 51/52*      (2006.01)

(52) U.S. Cl.
CPC ........ *H01L 27/3213* (2013.01); *H01L 27/326* (2013.01); *H01L 27/3272* (2013.01); *H01L 27/322* (2013.01); *H01L 27/3246* (2013.01); *H01L 51/5225* (2013.01); *H01L 2251/5338* (2013.01)

(58) Field of Classification Search
CPC ............... H01L 27/3213; H01L 27/322; H01L 27/3241; H01L 27/3246
See application file for complete search history.

(56) References Cited

U.S. PATENT DOCUMENTS

| | | | |
|---|---|---|---|
| 2006/0154554 A1 | 7/2006 | Nomura et al. | |
| 2009/0108743 A1* | 4/2009 | Kobayashi | H01L 51/5281 313/504 |
| 2009/0262258 A1* | 10/2009 | Taneda | G09G 3/3233 348/739 |
| 2014/0111116 A1* | 4/2014 | Shin | H01L 27/3279 315/312 |
| 2015/0227172 A1 | 8/2015 | Namkung et al. | |
| 2015/0373828 A1 | 12/2015 | Ye et al. | |
| 2016/0099294 A1* | 4/2016 | Jeong | H01L 27/3213 257/40 |
| 2016/0118451 A1 | 4/2016 | Youn et al. | |

(Continued)

FOREIGN PATENT DOCUMENTS

| | | |
|---|---|---|
| DE | 696 08 487 T2 | 9/2000 |
| JP | 2004-139892 A | 5/2004 |
| JP | 2006-73222 A | 3/2006 |

(Continued)

*Primary Examiner* — Phat X Cao
(74) *Attorney, Agent, or Firm* — Seed Intellectual Property Law Group LLP

(57) ABSTRACT

Display devices are disclosed herein. In one embodiment, the display device includes a plastic substrate comprising a display area and a non-display area, and a data pad portion disposed on one side of the non-display area, with a flexible circuit board bonded thereto, the display area including a plurality of subpixels positioned on the display area, each subpixel including an organic light-emitting diode that includes an organic layer, wherein the organic layer extends continuously from one side of the display area to the other side of the display area and is arranged in a plurality of lines that are spaced apart from one another and disposed parallel to the data pad portion.

18 Claims, 14 Drawing Sheets

(56) References Cited

U.S. PATENT DOCUMENTS

2016/0307976 A1* 10/2016 You .................... H01L 27/3246

FOREIGN PATENT DOCUMENTS

| | | |
|---|---|---|
| JP | 2104-86413 A | 5/2014 |
| JP | 2015-46263 A | 3/2015 |
| KR | 10-2014-0051874 A | 5/2014 |
| KR | 10-2016-0040355 A | 4/2016 |
| TW | 201426983 A | 7/2014 |
| WO | 2011/043099 A1 | 4/2011 |
| WO | 2011/068158 A1 | 6/2011 |
| WO | 2012/001728 A1 | 1/2012 |
| WO | 2012/091018 A1 | 7/2012 |

* cited by examiner

DISPLAY DEVICE

CROSS-REFERENCE TO RELATED APPLICATIONS

This application claims the priority benefit of Korean Patent Application No. 10-2016-0109133 filed on Aug. 26, 2016, which is incorporated herein by reference for all purposes as if fully set forth herein.

BACKGROUND

Technical Field

The present disclosure relates to a display device, and more particularly, to a display device which can prevent operational faults.

Description of the Related Art

With the development of the information society, various demands for display devices for displaying images are on the rise. In the field of display devices, flat panel displays (FPDs), which are thin and light and can cover a large area, have been rapidly replacing cathode ray tubes (CRTs), which are bulky. For example, a variety of flat panel displays have been developed and used, including liquid crystal displays (LCDs), plasma display panels (PDPs), organic light-emitting displays (OLEDs), electrophoretic displays (EDs), etc.

Among these types of displays, the organic light-emitting displays are self-luminous devices, and have fast response time, high light emission efficiency, great brightness, and wide viewing angles. Notably, the organic light-emitting displays can be fabricated on a flexible plastic substrate, and have advantages over plasma display panels or inorganic light emitting displays in that they can operate at a low voltage, have lower power consumption, and deliver vivid color reproduction.

To fabricate an organic light-emitting display on a flexible plastic substrate, polyimide is coated on a glass substrate, elements such as organic light-emitting diodes comprising an organic layer are then prepared, and a flexible circuit board such as a chip-on film (COF) is then bonded onto a pad portion. Then, by removing the glass substrate, an organic light-emitting display with a flexible polyimide substrate is fabricated.

FIG. 1 is a view showing a deposition process of an organic layer. FIG. 2 is a view showing a stress applied on a substrate.

An organic layer of an organic light-emitting diode is formed over the entire display area that displays images. To this end, as shown in FIG. 1, an organic layer EML is formed by depositing an organic matter source SOU using an open mask OM for opening the entire display area A/A of a substrate SB. However, as shown in FIG. 2, if the flexible substrate SUB is bent or rolled up, a stress is applied to the top of the substrate SUB and to the bottom as well. The organic layer EML formed over the substrate SUB is partially peeled off by stress because of its low adhesion strength. This may cause operational faults in the organic light-emitting display.

BRIEF SUMMARY

An aspect of the present disclosure is to provide a display device which can alleviate stress by dividing an organic layer into multiple pieces.

Another aspect of the present disclosure is to provide a display device which can prevent operational faults by preventing an organic layer from peeling.

In one aspect, there is provided a display device comprising a plastic substrate comprising a display area and a non-display area excluding the display area, and a data pad portion disposed on one side of the non-display area, with a flexible circuit board bonded thereto, the display area comprising a plurality of subpixels positioned on the display area, each subpixel comprising an organic light-emitting diode that at least comprises an organic layer, wherein the organic layer extends continuously from one side of the display area to the other side of the display area and is arranged in a plurality of lines that are spaced apart from one another and disposed parallel to the data pad portion.

Each subpixel comprises a light-emitting part and a driving part, and the organic layer overlaps the entire light-emitting part.

The lines of the organic layer are spaced with gaps in between.

The gaps do not overlap the light-emitting parts but overlap the driving parts.

At least one gap is placed perpendicular to the long axis of the lines of the organic layer.

The display device further comprising at least one organic film pattern positioned between two of the lines of the organic layer adjacent to each other among the lines of the organic layer, wherein the organic film pattern is disposed parallel to the lines of the organic layer.

The organic film pattern is spaced apart from two of the lines of the organic layer adjacent to the organic film pattern.

The display device bends in a direction perpendicular to the long axis of the data pad portion.

The long axis of the lines of the organic layer is parallel to the long axis of the data pad portion.

The lines of the organic layer are spaced apart from each other by a period of the at least one subpixel arranged in a direction perpendicular to the long axis of the lines of the organic layer.

The organic light-emitting diode emits white light.

In one aspect, there is provided a display device comprising a plastic substrate comprising a display area and a non-display area outside the display area, and a data pad portion disposed on one side of the non-display area, with a flexible circuit board bonded thereto, the display area comprising a plurality of subpixels positioned on the display area, each subpixel comprising an organic light-emitting diode that at least comprises an organic layer, wherein the organic layer extends continuously from one side of the display area to the other side and is arranged in a plurality of lines that are spaced apart from one another and disposed parallel to the data pad portion, and the light-emitting diode emits white light.

The display device further comprising a color filter that is positioned in the display area and converts the white light emitted from the organic light-emitting diode to a different color.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
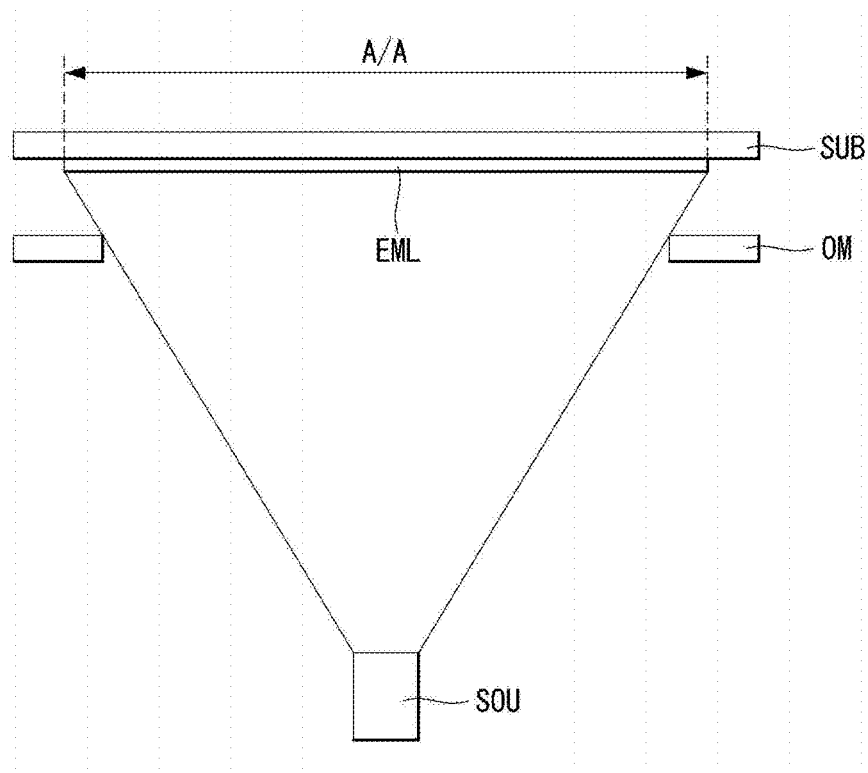
FIG. 1 is a view showing a deposition process of an organic layer.

Hereinafter, exemplary embodiments of the present disclosure will be described in detail with reference to the accompanying drawings. Like reference numerals designate substantially like elements throughout the specification. In the following description, detailed descriptions of well-known functions or configurations associated with the present disclosure will be omitted if they are deemed to unnecessarily obscure the subject matters of the present disclosure. The names of the elements used in the following description may be selected for ease of writing the specification, and may be different from the names of parts in actual products.

A display device according to the present disclosure may be a plastic display with a display element formed on a flexible plastic substrate. Examples of the plastic display may include an organic light-emitting display, a liquid crystal display, an electrophoresis display, etc., and the present disclosure will be described with respect to, but is not limited to, an organic light-emitting display. The organic light-emitting display comprises an organic layer composed of organic materials situated between a first electrode as an anode and a second electrode as a cathode. A hole from the first electrode and an electron from the second electrode recombine within the organic layer, forming an exciton, i.e., a hole-electron pair. Then, energy is created as the exciton returns to the ground state, thereby causing the self-luminous display to emit light. The organic light-emitting display according to the present disclosure may be formed on a glass substrate, as well as on a plastic substrate.

Hereinafter, exemplary embodiments of the present disclosure will be described with reference to the attached drawings.

Figure 3:
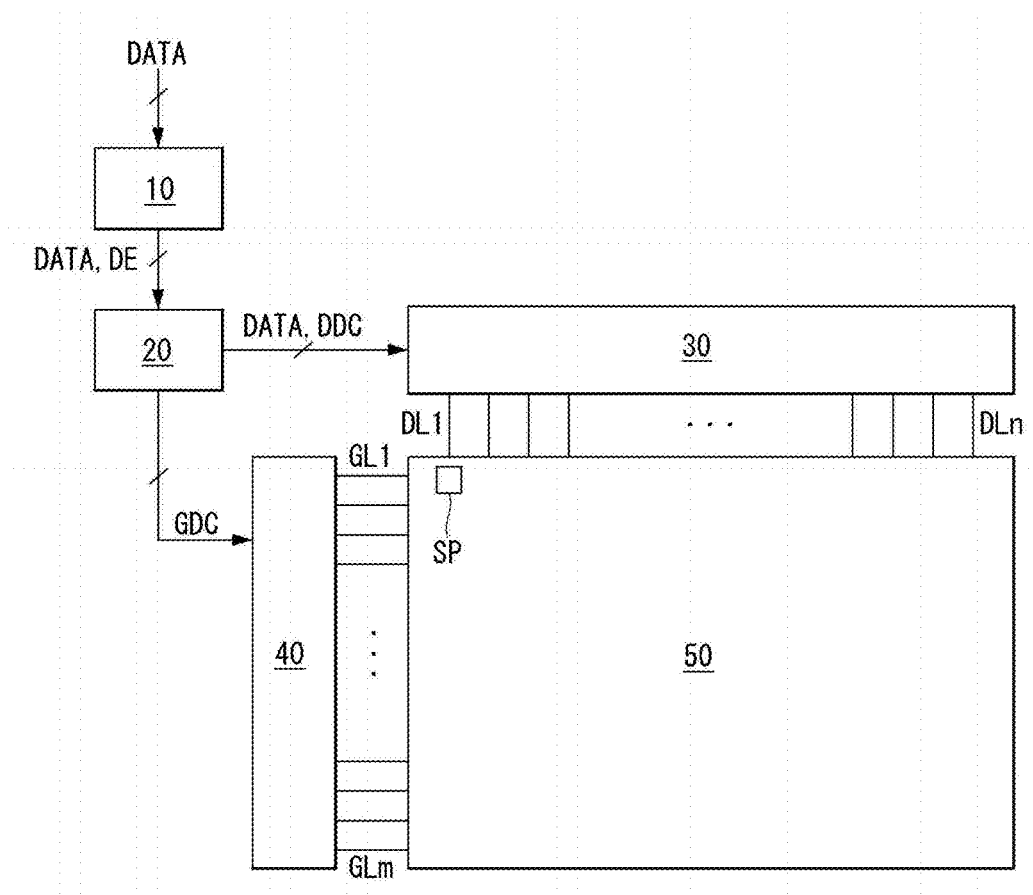
FIG. 3 is a schematic block diagram of an organic light-emitting display.
Figure 4:
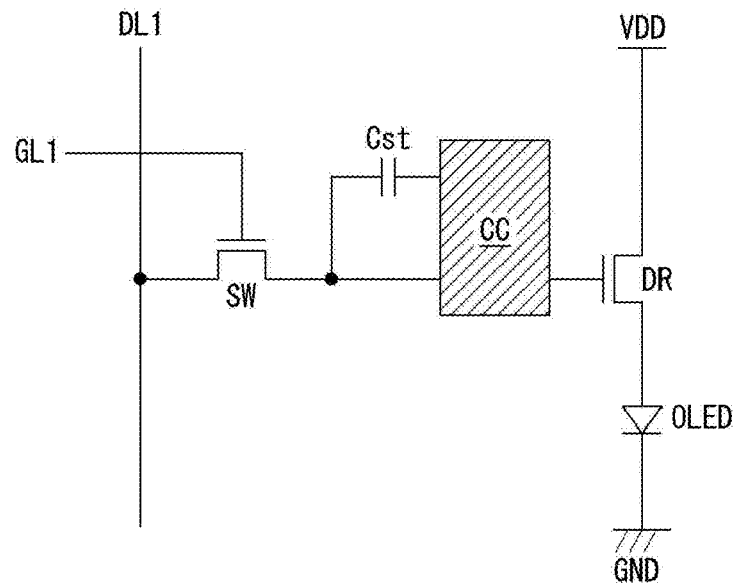
FIG. 4 is a first illustration of a circuit configuration of a subpixel.
Figure 5:
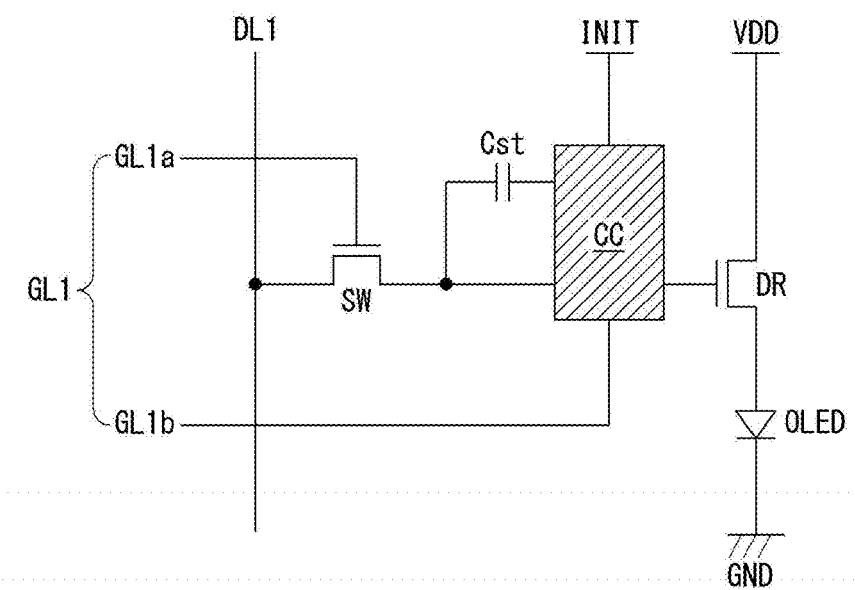
FIG. 5 is a second illustration of a circuit configuration of a subpixel.

FIG. 3 is a schematic block diagram of an organic light-emitting display. FIG. 4 is a first illustration of a circuit configuration of a subpixel, in accordance with one or more embodiments. FIG. 5 is a second illustration of a circuit configuration of a subpixel, in accordance with one or more embodiments.

Referring to FIG. 3, an organic light-emitting display includes an image processor 10, a timing controller 20, a data driver 30, a gate driver 40, and a display panel 50.

The image processor 10 outputs a data enable signal DE, etc., along with an externally supplied data signal DATA. The image processor 10 may output one or more among a vertical synchronization signal, horizontal synchronization signal, and clock signal, in addition to the data enable signal DE, but these signals are not shown in the drawings for convenience of explanation. The image processor 10 may be provided in the form of an IC (integrated circuit) on a system circuit board.

The timing controller 20 receives the data signal DATA from the image processor 10, along with the data enable signal DE or driving signals including the vertical synchronization signal, horizontal synchronization signal, and clock signal.

Based on the driving signals, the timing controller 20 outputs a gate timing control signal GDC for controlling the operation timing of the gate driver 40 and a timing control signal DDC for controlling the operation timing of the data driver 30. The timing controller 20 may be provided in the form of an IC on a control circuit board.

In response to the data timing control signal DDC supplied from the timing controller 20, the data driver 30 samples and latches the data signal DATA supplied form the timing controller 20, converts it to a gamma reference voltage, and outputs the gamma reference voltage. The data driver 30 outputs the data signal through data lines DL1 to DLn. The data driver 30 may be bonded onto a substrate in the form of an IC.

In response to the gate timing control signal GDC supplied from the timing controller 20, the gate driver 40 outputs a gate signal while shifting the level of a gate voltage. The gate driver 40 outputs the gate signal through gate lines GL1 to GLm. The gate driver 40 is formed on a gate circuit substrate in the form of an IC, or is formed on the display panel 50 by a gate-in-panel technology.

The display panel 50 displays an image, corresponding to the data signal DATA and gate signal respectively supplied from the data driver 30 and gate driver 40. The display panel 50 includes subpixels SP that display an image.

Referring to FIG. 4, each subpixel includes a switching transistor SW, a driving transistor DR, a compensation circuit CC, and an organic light-emitting diode OLED. The organic light-emitting diode OLED operates to emit light in response to a drive current provided by the driving transistor DR.

In response to a gate signal supplied through the gate line GL1, the switching transistor SW is switched on so that a data signal supplied through the first data line DL1 is stored as a data voltage in a capacitor Cst. The driving transistor DR operates so that a driving current flows between a high-level power supply line VDD and a low-level power supply line GND in response to the data voltage stored in the capacitor Cst. The compensation circuit CC is a circuit for compensating characteristics (e.g., the threshold voltage, etc.) of the driving transistor DR. Moreover, the capacitor Cst connected to the switching transistor SW or driving transistor DR may be positioned within the compensation circuit CC.

The compensation circuit CC includes one or more thin film transistors and a capacitor. The compensation circuit CC has a wide variety of configurations depending on the compensation method, so a detailed illustration and description of this will be omitted.

As shown in FIG. 5, with the addition of the compensation circuit CC, the subpixel may further include a signal line, power supply line, etc. for supplying a particular signal or power, as well as driving a compensation thin-film transistor. The gate line GL1 may include a (1-1)-th gate line GL1a for supplying a gate signal to the switching transistor SW and a (1-2)-th gate line GL1b (i.e., a gate line for supplying a gate signal to a switching transistor of an adjacent subpixel in a next row) for driving the compensation thin-film transistor included in the subpixel. The additional power supply line may be defined as a reset power supply line INIT for resetting a particular node of the subpixel. The circuits shown in FIGS. 4 and 5 are for illustrative purposes only, and the present disclosure is not limited to such circuit configurations.

Meanwhile, FIGS. 4 and 5 illustrate a subpixel including a compensation circuit CC by way of example. However, if a compensating entity or circuit is located outside the subpixel, such as in the data driver 30, etc., then the compensation circuit CC may be omitted from the circuits shown in FIGS. 4 and 5, in accordance with one or more embodiments. That is, each subpixel may have a 2T(transistor)1C(capacitor) structure including a switching transistor SW, a driving transistor DR, a capacitor, and an organic light-emitting diode OLED, or may have various alternative structures like 3T1C, 4T2C, 5T2C, 6T2C, 7T2C, etc., for example, in embodiments where the compensation circuit CC is included in the subpixel.

Although FIGS. 4 and 5 illustrate that the compensation circuit CC is positioned between the switching transistor SW and the driving transistor DR, in one or more embodiments, the compensation circuit CC may be positioned between the driving transistor DR and the organic light-emitting diode OLED. The position and structure of the compensation circuit CC is not limited to those shown in FIGS. 4 and 5.

First Exemplary Embodiment

Figure 6:
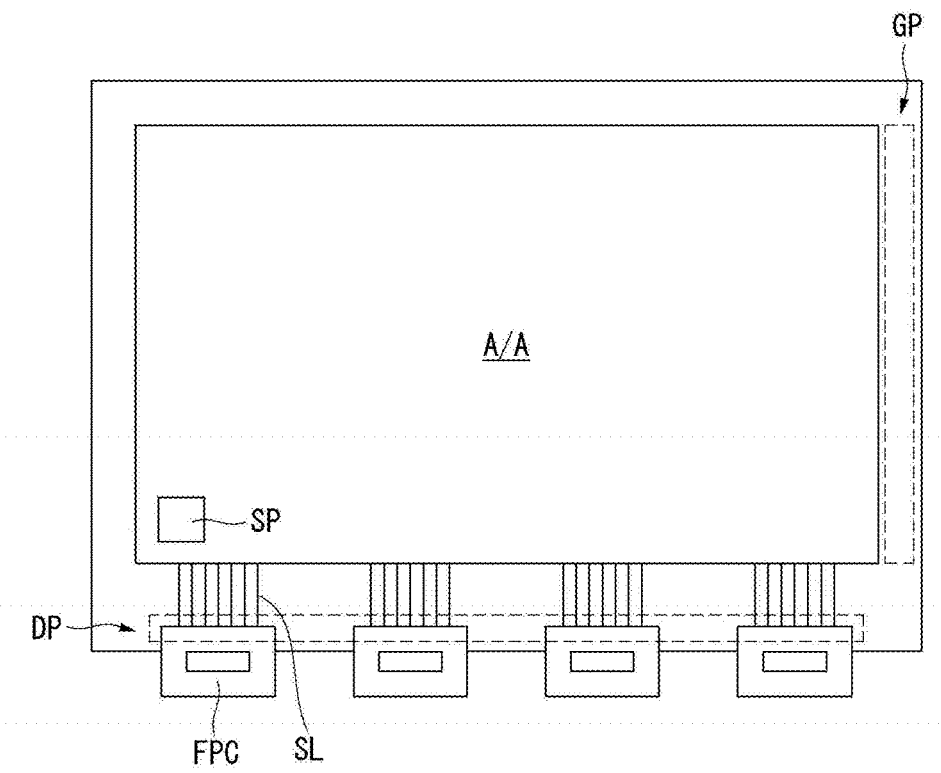
FIG. 6 is a top plan view showing an organic light-emitting display according to a first exemplary embodiment of the present disclosure.
Figure 7:
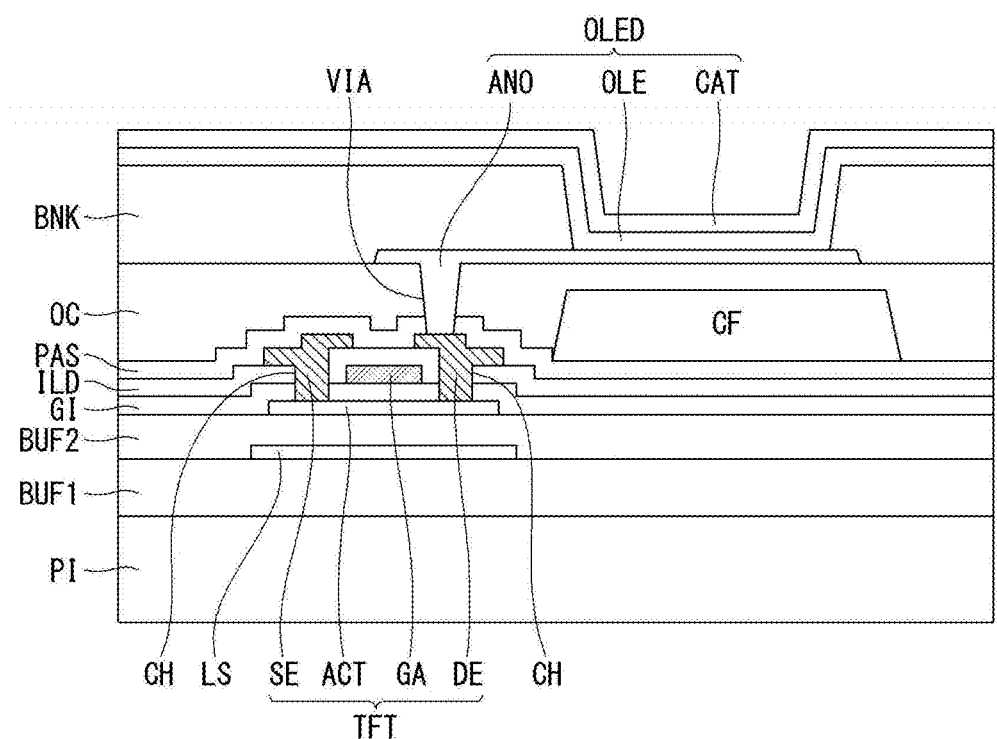
FIG. 7 is a cross-sectional view of a subpixel of an organic light-emitting display according to one or more embodiments.

FIG. 6 is a top plan view showing an organic light-emitting display according to a first exemplary embodiment of the present disclosure. FIG. 7 is a cross-sectional view of a subpixel of the organic light-emitting display in accordance with one or more embodiments.

Referring to FIG. 6, the organic light-emitting display includes a plastic substrate PI, a display area A/A, a non-display area N/A outside the display area A/A, and a gate pad portion GP and data pad portion DP positioned in the non-display area N/A. The display area A/A has a plurality of subpixels SP which emit red (R), green (G), and blue (B) lights or R, G, B, and white (W) lights to reproduce full-color images. The gate pad portion GP may be or include a gate-in-panel (GIP) driver that is placed on one side of the display area A/A, for example, on the right or left side of the non-display area N/A so that a gate signal line (not shown) extending from the display area A/A is connected to a plurality of thin-film transistors. However, the gate pad portion is only an example of the present disclosure, and a flexible circuit board may be bonded to it, like the data pad portion to be described later. The data pad portion DP may have a plurality of signal lines SL placed on one side of the display area A/A, for example, on the bottom side of the non-display area N/A and extending from the display area A/A. The signal lines SL may be data lines or power supply lines, and may further include sensing lines. The signal lines SL are applied with a data signal and power through a flexible circuit board FPC such as a chip-on film bonded to the data pad portion DP.

Now, a cross-sectional structure of each subpixel SP of the organic light-emitting display according to embodiments of the present disclosure will be described with reference to FIG. 7.

Referring to FIG. 7, an organic light-emitting display according to an exemplary embodiment of the present disclosure has a first buffer layer BUF1 positioned on a plastic substrate PI. The plastic substrate PI may be a polyimide substrate, for example. Thus, the plastic substrate according to embodiments of this disclosure has flexibility. The first buffer layer BUF1 serves to protect the thin-film transistors to be formed in a subsequent process from impurities such as alkali ions leaching out of the plastic substrate PI. The first buffer layer BUF1 may be a silicon oxide (SiOx), a silicon nitride (SiNx), or multiple layers of these compounds.

A shield layer LS is positioned on the first buffer layer BUF1. The shield layer LS serves to prevent a reduction in panel drive current that may occur from the use of the polyimide substrate. A second buffer layer BUF2 is positioned on the shield layer LS. The second buffer layer BUF2 serves to protect the thin-film transistors to be formed in a subsequent process from impurities such as alkali ions leaching out of the plastic substrate PI. The second buffer layer BUF2 may be a silicon oxide (SiOx), a silicon nitride (SiNx), or multiple layers of these compounds.

A semiconductor layer ACT is positioned on the second buffer layer BUF2. The semiconductor layer ACT may be made of silicon semiconductor or oxide semiconductor materials. The silicon semiconductor may comprise amorphous silicon or crystallized polycrystalline silicon. The polycrystalline silicon offers low energy consumption and excellent reliability, with high mobility (of 100 $cm^2$/V or greater), so it can be used in gate drivers for driving elements and/or multiplexers MUS or used in driving TFTs within pixels. Meanwhile, due to its low off current, the oxide semiconductor is suitable for switching TFTs which are kept ON for a short time and OFF for a long time. Moreover, the oxide semiconductor is suitable for displays that require slow driving and/or low power consumption because its low off current can lengthen the pixels' voltage holding period. In addition, the semiconductor layer ACT comprises a drain region and a source region that comprise a p-type or n-type impurity, and comprises a channel between the drain and source regions.

A gate insulating film GI is positioned on the semiconductor layer ACT. The gate insulating film GI may be a silicon oxide SiOx, a silicon nitride SiNx, or multiple layers of these compounds. A gate electrode GA is positioned on the gate insulating film GI, corresponding to a certain area of the semiconductor layer ACT, that is, a channel for injecting an impurity. The gate electrode GA may be made up of any one selected from the group consisting of molybdenum (Mo), aluminum (Al), chrome (Cr), gold (Au), titanium (Ti), nickel (Ni), neodymium (Nd), and copper (Cu) or multiple layers of alloys of these elements. For example, the gate electrode GA may consist of dual layers of molybdenum/aluminum-neodymium or molybdenum/aluminum.

An interlayer insulating film ILD for insulating the gate electrode GA is positioned on the gate electrode GA. The interlayer insulating film ILD may be a silicon oxide (SiOx), a silicon nitride (SiNx), or multiple layers of these compounds. Contact holes CH exposing part of the semiconductor layer ACT are positioned in some regions of the interlayer insulating film ILD and gate insulating film GI.

A drain electrode DE and a source electrode SE are positioned on the interlayer insulating film ILD. The drain electrode DE is connected to the semiconductor layer ACT via the contact hole CH exposing the drain region of the semiconductor layer ACT, and the source electrode SE is connected to the semiconductor layer ACT via the contact hole CH exposing the source region of the semiconductor layer ACT. The source electrode SE and the drain electrode DE may consist of a single layer or multiple layers. If the source electrode SE and the drain electrode DE consist of a single layer, they may be made up of any one selected from the group consisting of molybdenum (Mo), aluminum (Al), chrome (Cr), gold (Au), titanium (Ti), nickel (Ni), neodymium (Nd), and copper (Cu), or an alloy of these elements. On the other hand, if the source electrode SE and the drain electrode DE consist of multiple layers, they may be made up of two layers of molybdenum/aluminum-neodymium or three layers of titanium/aluminum/titanium, molybdenum/aluminum/molybdenum, or molybdenum/aluminum-neodymium/molybdenum.

As such, a thin film transistor TFT including the semiconductor layer ACT, the gate electrode GA, the drain electrode DE, and the source electrode SE is formed.

A passivation film PAS is positioned on the plastic substrate PI including the thin film transistor TFT. The passivation film PAS is an insulating film that protects the underlying elements, and may be a silicon oxide (SiOx), a silicon nitride (SiNx), or multiple layers of these compounds. A color filter CF is positioned on the passivation film PAS. The color filter CF serves to convert white light emitted from the organic light-emitting diode OLED to red, green, or blue light. An overcoat layer OC is positioned on the color filter CF. The overcoat layer OC may be a planarization film for smoothing out irregularities on the underlying structure, and is made of an organic material such as polyimide, benzocyclobutene-based resin, acrylate, etc. The overcoat layer OC may be formed by a method such as SOG (spin on glass), by which the organic material is coated in liquid form and hardened.

A via hole VIA exposing the drain electrode DE is positioned in some region of the overcoat layer OC. The organic light-emitting diode OLED is positioned on the overcoat layer OC. More specifically, a first electrode ANO is positioned on the overcoat layer OC. The first electrode ANO may act as an anode, and is connected to the drain electrode DE of the driving thin-film transistor TFT. The first electrode ANO is an anode, and may be made of a transparent conductive material, for example, ITO (indium tin oxide), IZO (indium zinc oxide), or ZnO (zinc oxide). In one or more embodiments, the first electrode ANO may be a reflective electrode, and may further include a reflective layer. The reflective layer may be made of aluminum (Al), copper (Cu), silver (Ag), nickel (Ni), or an alloy of these elements, preferably, APC (silver/palladium/copper alloy).

A bank layer BNK for defining a pixel is positioned on the plastic substrate 110 including the first electrode ANO. The bank layer BNK is made of an organic material such as polyimide, benzocyclobutene-based resin, acrylate, etc. The bank layer BNK has a pixel defining portion exposing the first electrode ANO. An organic layer OLE contacting the first electrode ANO is positioned on the entire surface of the plastic substrate PI. The organic layer OLE is a layer that emits light by the recombination of electrons and holes. A hole injection layer or hole transport layer may be formed between the organic layer OLE and the first electrode ANO, and an electron transport layer or electron injection layer may be formed on the organic layer OLE.

A second electrode CAT is positioned on the organic layer OLE. The second electrode CAT is positioned on the entire surface of the display area A/A, is a cathode, and may be made of magnesium (Mg), calcium (Ca), aluminum (Al), silver (Ag), or an alloy of these elements, having a low work function. If the second electrode CAT is a transmissive electrode, it may be formed thin enough to pass light therethrough. On the other hand, if the second electrode CAT is a reflective electrode, it may be formed thick enough to reflect light.

The organic light-emitting display of the present disclosure includes an organic layer with a plurality of lines arranged and spaced apart from one another.

Figure 8:
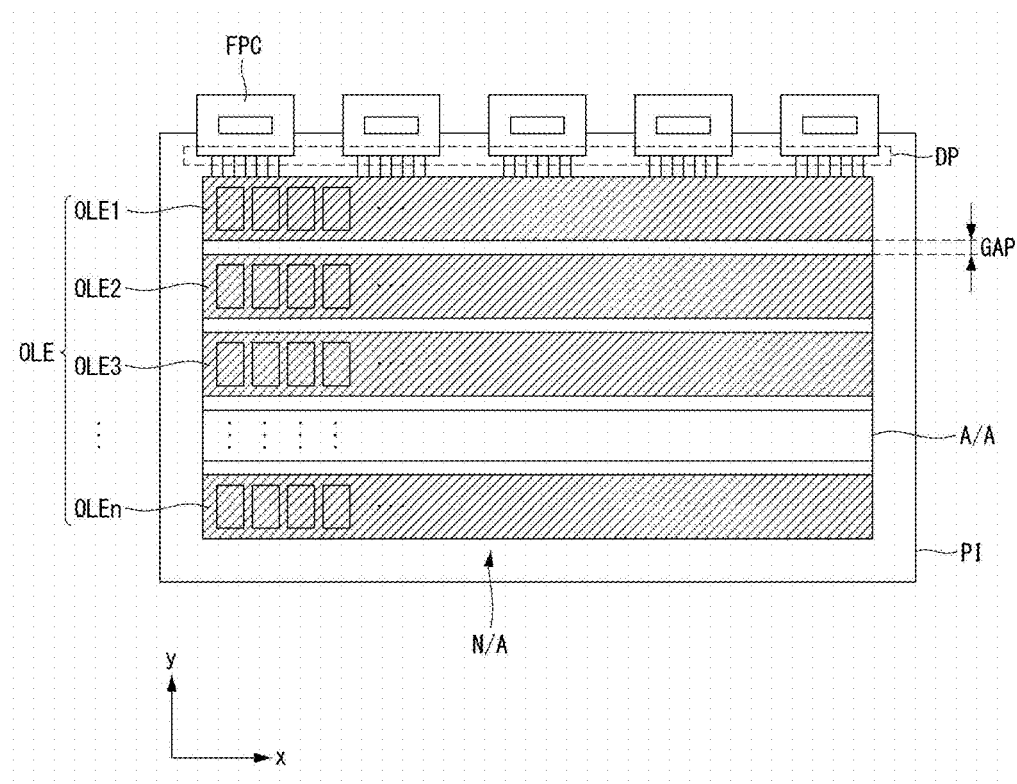
FIG. 8 is a view showing a plane of the organic light-emitting display according to the first exemplary embodiment of the present disclosure.
Figure 9:
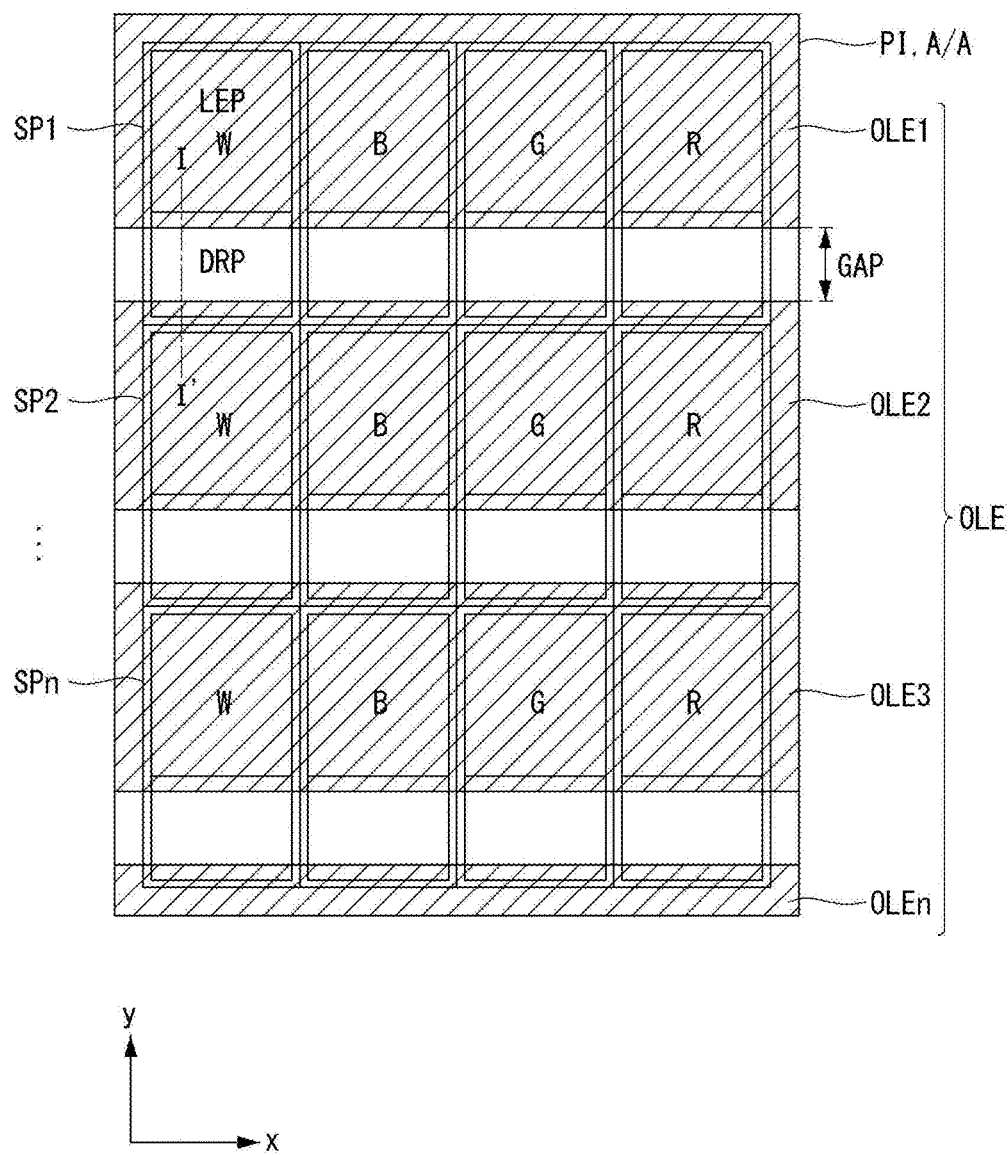
FIG. 9 is an enlarged view of a part of FIG. 8.
Figure 10:
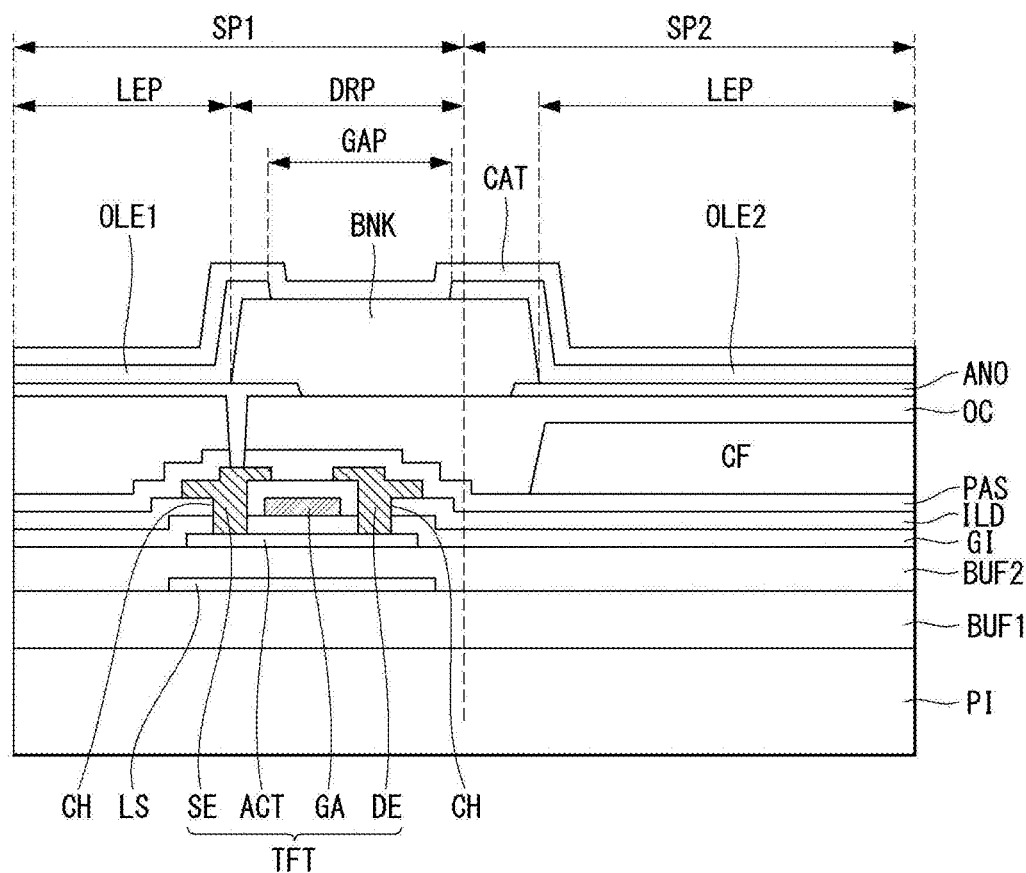
FIG. 10 is a cross-sectional view taken along the line I-I' of FIG. 9.
Figure 11:
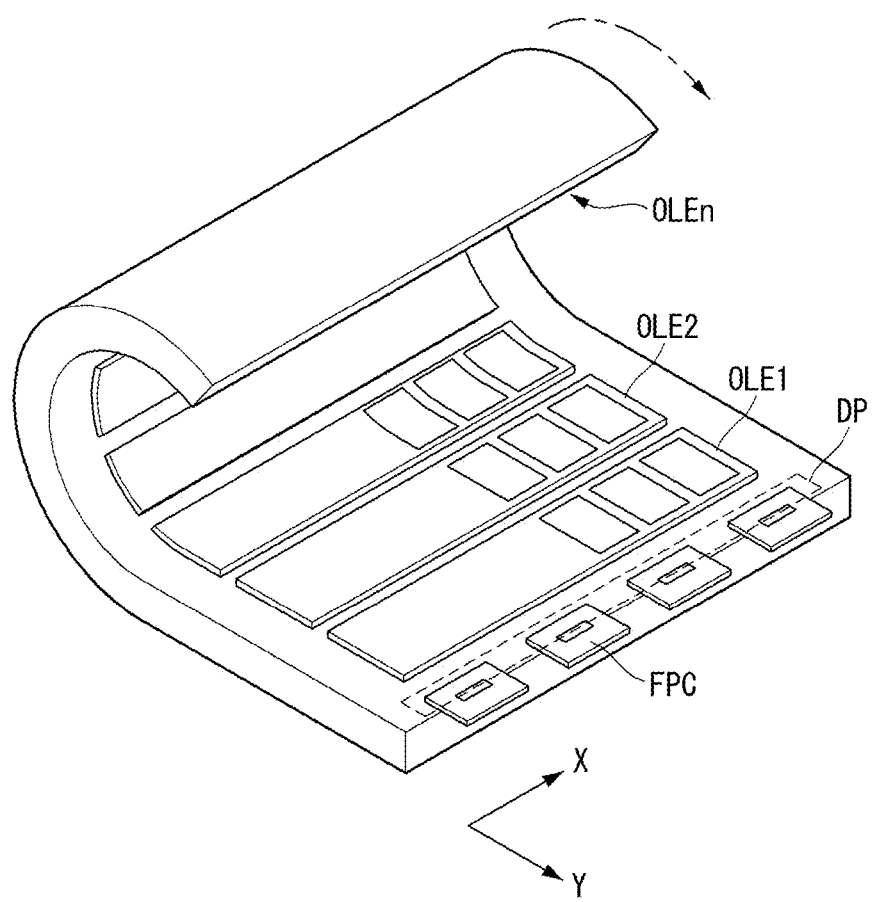
FIG. 11 is a view showing bending of the organic light-emitting display according to the first exemplary embodiment of the present disclosure.
Figure 12:
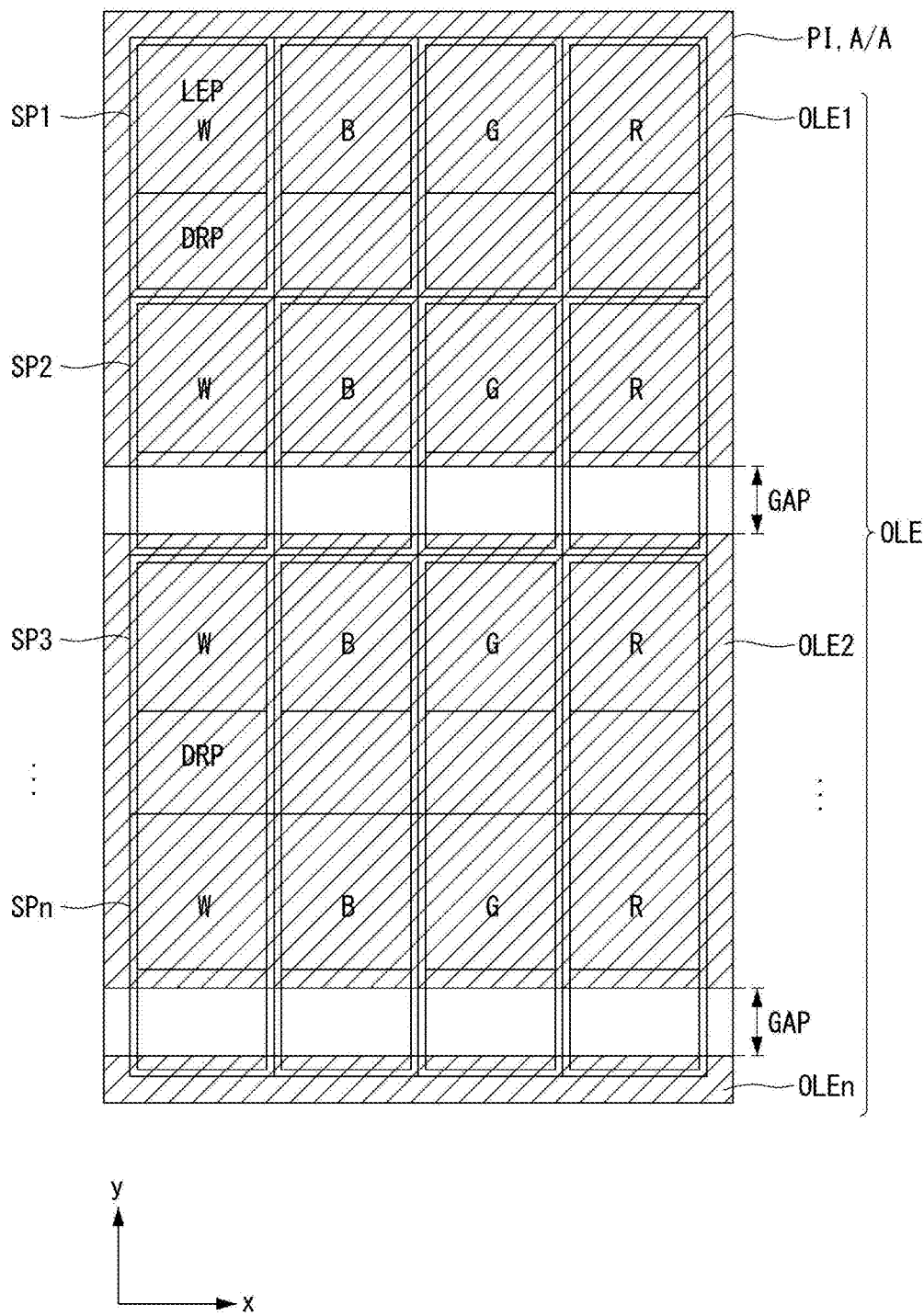
FIG. 12 is a view showing a plane of the organic light-emitting display according to the first exemplary embodiment of the present disclosure.
Figure 13:
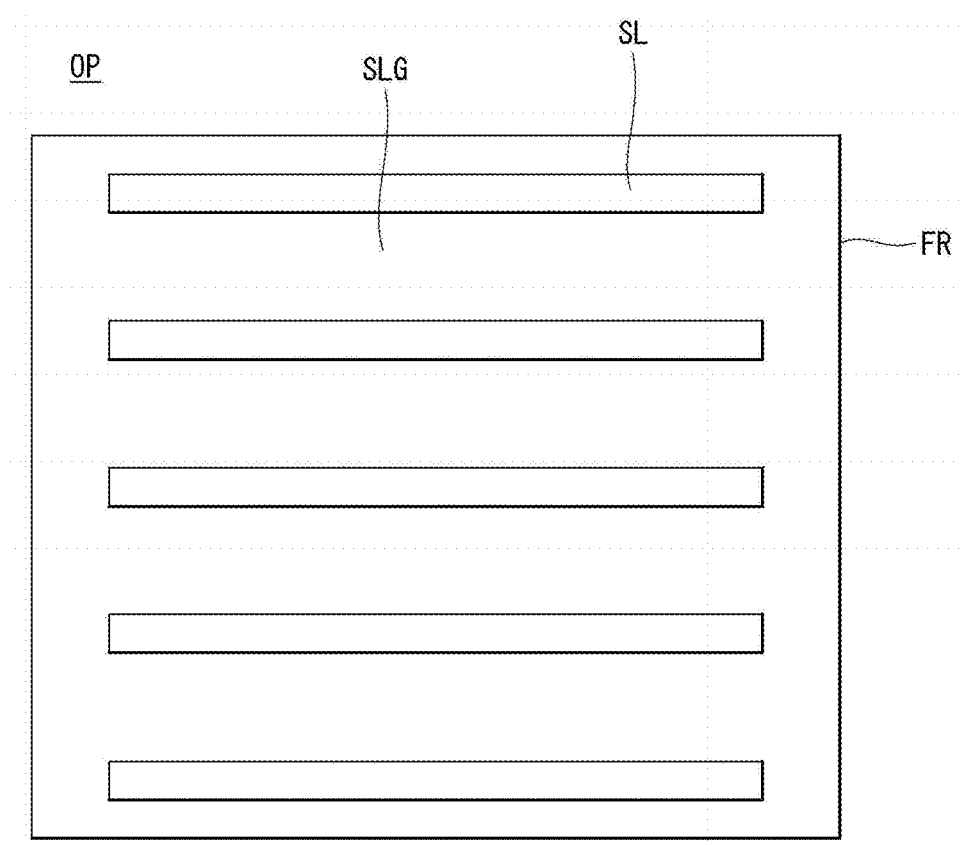
FIG. 13 is a view showing a mask for forming an organic layer according to the first exemplary embodiment of the present disclosure.

FIG. 8 is a view showing a plane of the organic light-emitting display according to the first exemplary embodiment of the present disclosure. FIG. 9 is an enlarged view of a part of FIG. 8. FIG. 10 is a cross-sectional view taken along the line I-I' of FIG. 9. FIG. 11 is a view showing bending of the organic light-emitting display according to the first exemplary embodiment of the present disclosure. FIG. 12 is a view showing the plane of the organic light-emitting display according to the first exemplary embodiment of the present disclosure. FIG. 13 is a view showing a mask for forming an organic layer according to the first exemplary embodiment of the present disclosure.

Referring to FIG. 8, the organic light-emitting display comprises a plastic substrate PI including a display area A/A and a non-display area N/A, a plurality of subpixels (not shown) arranged in the display area A/A and each comprising a light-emitting part LEP, and a data pad portion DP with a flexible circuit board FPC bonded on one side of the non-display area N/A. The light-emitting parts LEP of the subpixels (not shown) are disposed in the display area A/A, and an organic layer OLE overlaps the light-emitting parts LEP of the subpixels. The organic layer OLE consists of a plurality of lines OLE1 to OLEn spaced apart from one another, and overlaps the light-emitting parts LEP. The lines OLE1 to OLEn of the organic layer OLE extend continuously from one side of the display area A/A to the other side. The long axis (x-axis) of the lines OLE1 to OLEn of the organic layer OLE are disposed parallel to the long axis (x-axis) of the data pad portion DP. The lines OLE1 to OLEn of the organic layer OLE are spaced a certain distance apart from one another, with gaps GAP in between. Since the lines OLE1 to OLEn of the organic layer OLE extend continuously from one side of the display area A/A to the other side, the gaps GAP likewise extend continuously from one side of the display area A/A to the other side.

More specifically, referring to FIG. 9, a plurality of subpixels SP are disposed in the display area A/A of the plastic substrate PI. The subpixels SP may emit lights of white (W), blue (B), green (G), and red (R). The subpixels SP are arranged in a plurality of lines SP1 to SPn disposed along the x-axis. Each of the subpixels SP comprises a light-emitting part LEP that emits light and a drive part DRP that has transistors for driving the subpixel SP, a capacitor, etc.

The organic layer OLE of this disclosure includes a plurality of lines OLE1 to OLEn spaced apart from one another, and overlaps the light-emitting parts LEP. The first line OLE1 of the organic layer OLE overlaps the light-emitting parts LEP of the first line SP1 of subpixels SP, the second line OLE2 of the organic layer OLE overlaps the light-emitting parts LEP of the second line SP2 of subpixels S, and the nth line OLEn of the organic layer OLE overlaps the light-emitting parts LEP of the nth line SPn of subpixels S.

The lines OLE1 to OLEn of the organic layer OLE are spaced a certain distance apart from one another, with gaps GAP in between. The gaps GAP may be as long as the distance between the light-emitting parts LEP of adjacent subpixels SP. If the gaps GAP partially overlap the light-emitting parts LEP, no light is emitted from the overlapping parts. Thus, it is desirable that the gaps GAP are spaced out such that they do not overlap the light-emitting parts LEP of the subpixels SP but overlap the driving parts DRP of the subpixels SP. The long axis (x-axis) of the gaps GAP are disposed parallel to the long axis (x-axis) of the lines OLE1 to OLEn of the organic layer OLE.

Referring to FIG. 10, a cross-sectional structure of the first and second lines OLE1 and OLE2 of the organic layer OLE and the gaps GAP will be described. A redundant description of those features shown in FIG. 7 will be omitted below.

Among all the subpixels, each of the subpixels corresponding to the first and second lines SP1 and SP2 comprises a light-emitting part LEP and a driving part DRP. The first line OLE1 of the organic layer is positioned on the first line SP1 of subpixels, and the second line OLE2 of the organic layer is positioned on the second line SP2 of subpixels. The bank layer BNK defines each light-emitting part LEP of the subpixels corresponding to the first and second lines SP1 and SP2, and the bank layer BNK corresponds to the area other than the light-emitting parts LEP. The first and second lines OLE1 and OLE2 of the organic layer are spaced a certain distance apart from each other on the bank layer BNK, leaving a gap GAP between them. Since the bank layer BNK corresponds to the area other than the light-emitting parts LEP, and the driving parts DRP of the first line SP1 of subpixels correspond to a part of the cross-section indicated by the dotted line, the bank layer BNK overlaps the driving parts DRP. Thus, the gap GP between the first and second lines OLE1 and OLE2 of the organic layer OLE is positioned in a way that overlaps the driving parts DRP.

Moreover, the top of the gap GAP is covered with the second electrode CAT, bringing the second electrode CAT into contact with the bank layer BNK. As such, the adhesion strength of the second electrode CAT may be improved by partially bonding the second electrode CAT to the bank layer BNK which has higher adhesion strength than the organic layer OLE.

Figure 2:
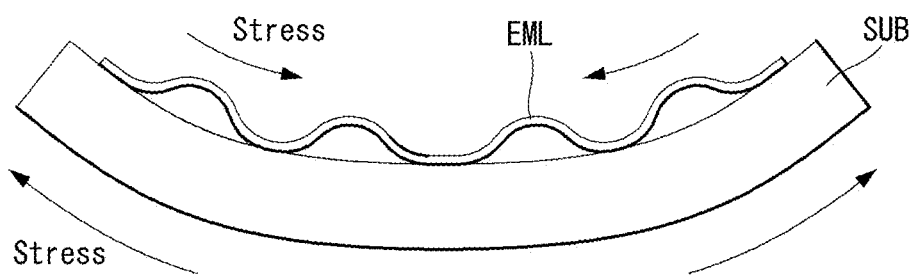
FIG. 2 is a view showing a stress applied on a substrate.

As above, the present disclosure discloses the formation of an organic layer in a plurality of lines parallel to the long axis of the data pad portion. Referring to FIG. 11, the organic light-emitting display of this disclosure is formed on a flexible substrate PI and is therefore bendable in one direction, and the organic light-emitting display bends in a direction (y-axis) perpendicular to the long axis (x-axis) of the data pad portion. Also, the organic light-emitting display may bend in a direction (y-axis) perpendicular to the long axis (x-axis) of the lines OLE1 to OLEn of the organic layer OLE. As explained in FIG. 2, when the organic light-emitting display is bent, a stress is applied to the organic layer. In the present disclosure, however, the organic layer is formed in a plurality of lines in a direction perpendicular to the direction the organic light-emitting display bends, thereby leading to a drastic reduction in the stress applied to the lines of the organic layer when the display is bent.

Referring to FIG. 13, the above-described organic layer of this disclosure may be formed using a mask OP with a plurality of slits SL formed on a frame FR. The slits SL correspond to a plurality of lines of the organic layer, and the gaps SLG between the slits SL correspond to the gaps between the lines of the organic layer. Thus, some parts of the materials of the organic layer are blocked by the gaps SLG between the slits SL and therefore are not deposited on the plastic substrate, and the other parts are deposited on the plastic substrate through the slits SL, thus forming an organic layer consisting of a plurality of lines.

The above-described embodiment has been described with an example in which the lines of the organic layer have a spacing of one subpixel, perpendicular to the long axis of the lines of the organic layer. That is, the description has been made on the assumption that one line of the organic layer corresponds to one line of subpixels on a 1:1 basis. However, the present disclosure is not limited to this, and as shown in FIG. 12, the lines of the organic layer may have a spacing of two subpixels, perpendicular to the long axis of the lines of the organic layer. Although not shown, the lines of the organic layer may have a spacing of three subpixels, perpendicular to the long axis of the lines of the organic layer.

Second Exemplary Embodiment

Figure 14:
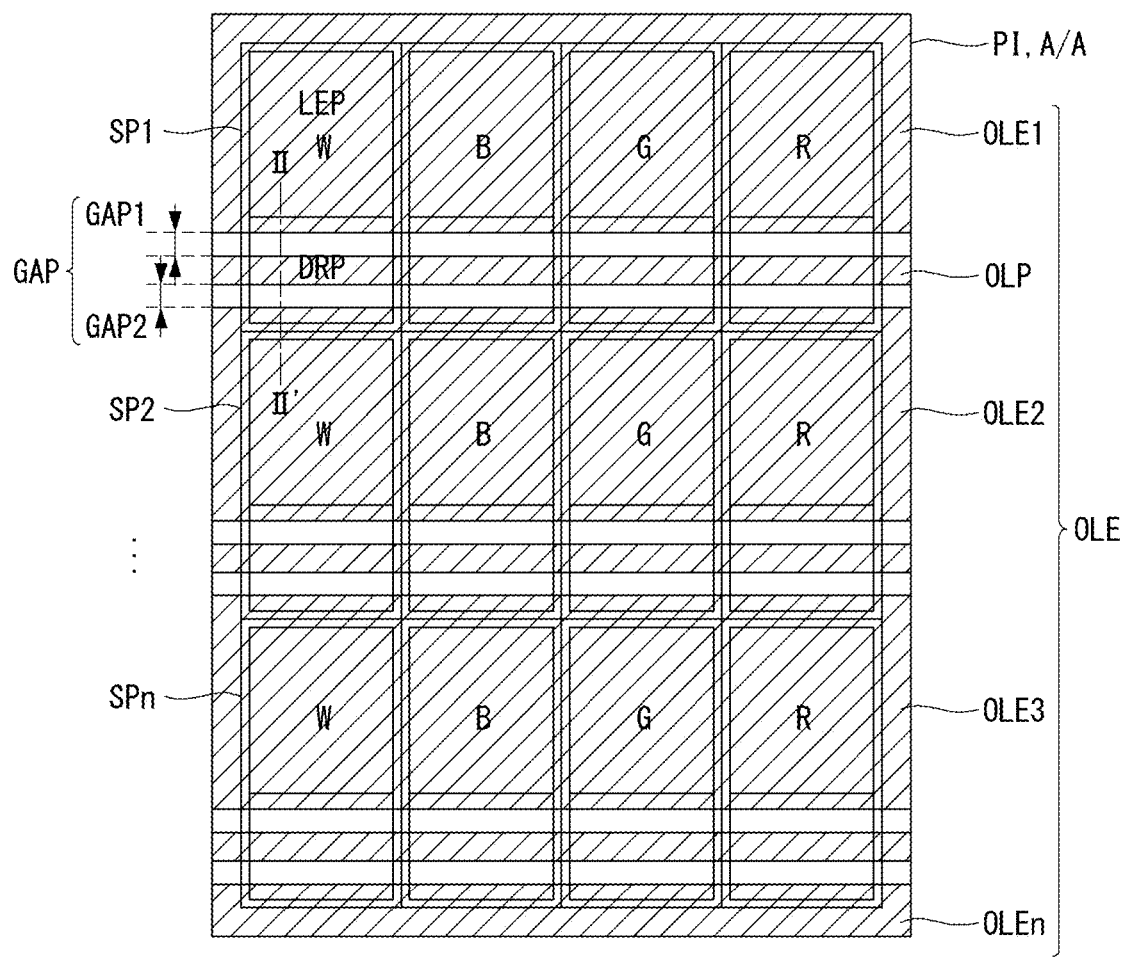
FIG. 14 is a view showing an organic light-emitting display according to a second exemplary embodiment of the present disclosure.
Figure 15:
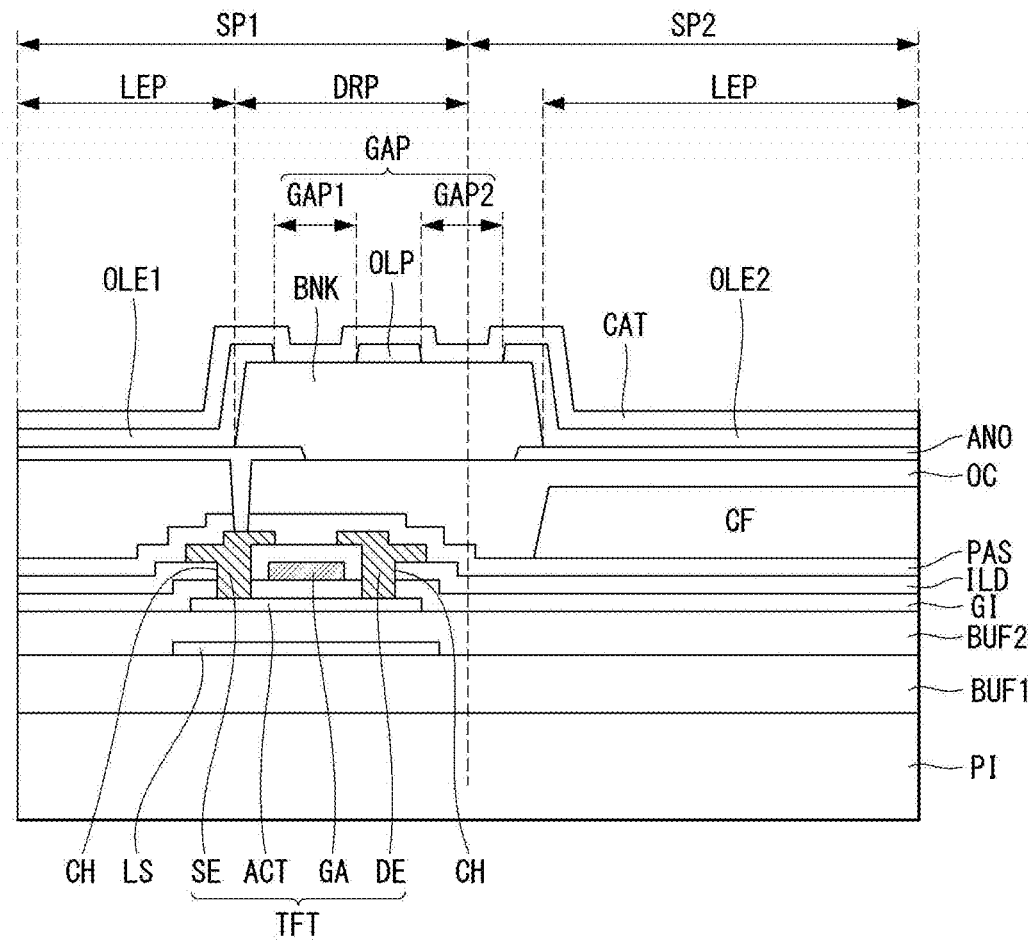
FIG. 15 is a cross-sectional view taken along the line II-II' of FIG. 14.

FIG. 14 is a view showing an organic light-emitting display according to a second exemplary embodiment of the present disclosure. FIG. 15 is a cross-sectional view taken along the line II-II' of FIG. 14. In the following, the same components as the foregoing first exemplary embodiment will be denoted by the same reference numerals, and descriptions of them will be omitted or briefly mentioned.

Referring to FIG. 14, a plurality of subpixels SP are disposed in the display area A/A of the plastic substrate PI. The subpixels SP are arranged in a plurality of lines SP1 to SPn disposed along the x-axis. The organic layer OLE consists of a plurality of lines OLE1 to OLEn spaced apart from one another, and overlaps a plurality of light-emitting parts LEP. The first line OLE1 of the organic layer OLE overlaps the first line SP1 of light-emitting parts LEP, the second line OLE2 of the organic layer OLE overlaps the second line SP2 of light-emitting parts LEP, and the nth line OLEn of the organic layer OLE overlaps the nth line SPn of light-emitting parts LEP.

In the second exemplary embodiment of the present disclosure, the organic light-emitting display further comprises organic film patterns OLP positioned between the lines OLE1 to OLEn of the organic layer OLE. More specifically, the lines OLE1 to OLEn of the organic layer OLE are spaced apart from one another, with gaps GAP in between. In this case, the organic film patterns OLP are positioned within the gaps GAP between the lines OLE1 to OLEn of the organic layer OLE. The organic film patterns OLP serve to increase the effective contact area of the overlying second electrode. Also, the organic film patterns OLP are formed of the same material as the organic layer OLE by using the same mask as the organic layer OLE, and serve as dummy patterns which do not emit light. Thus, it is desirable that the organic film patterns OLP positioned between the lines OLE1 to OLEn of the organic layer OLE are spaced out such that they do not overlap the light-emitting parts LEP of the subpixels SP but overlap the driving parts DRP of the subpixels SP.

The organic film patterns OLP positioned between the lines OLE1 to OLEn of the organic layer OLE are disposed parallel to the long axis (x-axis) of the lines OLE1 to OLEn of the organic layer OLE. Also, the lines OLE1 to OLEn of the organic layer OLE may extend continuously from one side of the display area A/A to the other side. Alternatively, the organic film patterns may occur discontinuously like dots. While this embodiment has been illustrated and described with an example in which one organic film pattern OLP is placed between the lines OLE1 to OLEn of the organic layer OLE, two or more organic film patterns OLP may be placed between them, perpendicular to the long axis (x-axis) of the lines OLE1 to OLEn of the organic layer OLE.

Due to the organic film patterns OLP, the gaps GAP between the OLE1 to OLEn of the organic layer OLE comprise a first gap GAP1 between the first line OLE1 of the organic layer OLE and an organic film pattern OLP and a second gap GAP2 between the second line OLE2 of the organic layer OLE and the organic film pattern OLP. Although the figure illustrates that the first gap GAP1 and the second gap GAP2 are identical, the present disclosure is not limited to this and they may be different from each other. The long axis (x-axis) of the first and second gaps GAP1 and GAP2 between the plurality of lines OLE1 to OLEn of the organic layer OLE and the organic film patterns OLP are disposed parallel to the long axis (x-axis) of the lines OLE1 to OLEn of the organic layer OLE.

Referring to FIG. 15, the first line OLE1 of the organic layer is positioned on the first line SP1 of subpixels, and the second line OLE2 of the organic layer is positioned on the second line SP2 of the subpixels. The bank layer BNK defines each light-emitting part LEP of the subpixels corresponding to the first and second lines SP1 and SP2, and the bank layer BNK corresponds to the area other than the light-emitting parts LEP. The first and second lines OLE1 and OLE2 of the organic layer are spaced apart from each other on the bank layer BNK, with a gap GAP in between, and an organic film pattern OLP is positioned in the gap GAP. Since the bank layer BNK overlaps the driving part DRP, the organic film pattern OLP is positioned in a way that overlaps the driving part DRP.

The first line OLE1 of the organic layer and the organic film pattern OLP are spaced apart with the first gap GAP1 in between, and the second line OLE2 of the organic layer and the organic film pattern OLP are spaced apart with the second gap GAP2 in between. The top of the first and second gaps GAP1 and GAP2, formed by spacing out the first and second lines OLE1 and OLE2 of the organic layer OLE, is covered with the second electrode CAT, bringing the second electrode CAT into partial contact with the bank layer BNK and into contact with the organic film pattern OLP. As such, the effective contact area of the second electrode CAT can be increased by partially bonding the second electrode CAT to the bank layer BNK with high adhesion strength and bonding the second electrode CAT to the side and top of the organic film pattern OLP, thereby improving the adhesion strength of the second electrode CAT.

As described above, the organic light-emitting displays according to the embodiments of the present disclosure offer the advantage of preventing the organic film layer from peeling off by a stress applied in a bending direction, because the organic layer is formed in a plurality of lines parallel to the long axis of the data pad portion. Moreover, the present disclosure can improve the adhesion strength of the second electrode by bringing the second electrode and the bank layer into contact with each other, because the lines of the organic layer are spaced out. Therefore, the organic light-emitting displays of this disclosure offer the advantage of preventing operational faults.

Hereinafter, data from a test of the characteristics of the organic layer according to a Comparative Example and Example embodiments of the present disclosure will be discussed.

Comparative Example

An organic light-emitting display was manufactured by forming a TFT array with a thickness of 20 μm on a PI substrate, forming an organic layer and a second electrode each with a thickness of 1 μm, and encapsulating them with a thickness of 20 μm.

Example 1

An organic light-emitting display was designed under the same process condition as the above Comparative Example, except that the organic layer was formed of a plurality of patterns.

Figure 16:
FIG. 16 shows the structures of the organic light-emitting displays of a comparative example and an embodiment of the present disclosure, their stresses at the center, and their FEM simulation images.

Stress measurements were made by bending the organic light-emitting displays according to the above Comparative Example and Example 1 to a certain radius of curvature by using finite element method (FEM) simulation. FIG. 16 shows the structures of the organic light-emitting displays of Comparative Example and Example 1, their stresses at the center, and their FEM simulation images.

Referring to FIG. 16, an organic layer with a single pattern according to the Comparative Example exhibited high stress throughout the entire area of the organic layer, with a stress of 7.7 Mpa at the center. On the other hand, an organic layer with multiple patterns according to Example 1 exhibited fairly low stress throughout the entire area of the organic layer, with a stress of 0.3 to 1.1 Mpa at the center.

From these results, it can be concluded that the organic layer with multiple patterns can drastically reduce bending stress compared to the organic layer with a single pattern. Therefore, it is clear that the present disclosure can drastically reduce bending stress by forming an organic layer in a plurality of lines.

Example 2

The above-described organic light-emitting display of FIG. 9 was manufactured. The lines of the organic layer were spaced 20 μm apart from one another, and an increase in the adhesion strength of the organic layer was measured while gradually increasing the spacing from 10 subpixels to 100 subpixels. The measurements are shown in FIG. 17.

Figure 17:
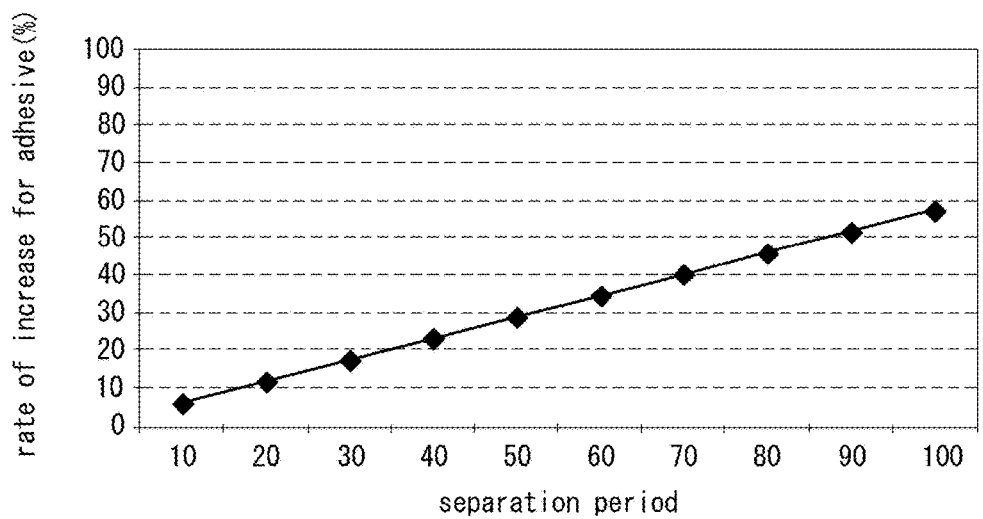
FIG. 17 is a graph showing an increase in the adhesion strength of an organic layer in accordance with embodiments of the present disclosure.

Referring to FIG. 17, it was observed that the adhesion strength of the organic layer increases in proportion to increasing spacing between the lines of the organic layer from 10 subpixels to 100 subpixels. Notably, the lines of the organic layer with a spacing of 100 subpixels showed a 57.3% increase in adhesion strength.

From these results, it is clear that the adhesion strength of the organic layer can be drastically improved by forming the organic layer in a plurality of spaced lines.

As described above, the organic light-emitting displays according to the embodiments of the present disclosure offer the advantage of preventing the organic film layer from peeling by a stress applied in a bending direction, because the organic layer is formed in a plurality of lines parallel to the long axis of the data pad portion. Moreover, the present disclosure can improve the adhesion strength of the second electrode by bringing the second electrode and the bank layer into contact with each other, because the lines of the organic layer are spaced out. Therefore, the organic light-emitting displays of this disclosure offer the advantage of preventing operational faults.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
a plastic substrate including a display area and a non-display area;
a data pad portion disposed in the non-display area, with a flexible circuit board bonded thereto; and
a plurality of subpixels positioned in the display area, the plurality of subpixels arranged in a plurality of lines of subpixels extending across the display area in a first direction, each of the lines of subpixels including a plurality of first subpixels configured to emit light of a first color and a plurality of second subpixels configured to emit light of a second color that is different from the first color, each subpixel including an organic light-emitting diode that includes an organic light-emitting layer,
wherein the organic light-emitting layer includes a plurality of lines that correspond to the plurality of lines of subpixels, each of the lines of the organic light-emitting layer extends continuously in the first direction from one side of the display area to another side of the display area, the plurality of lines of the organic light-emitting layer being spaced apart from one another along a second direction that is transverse to the first direction and disposed parallel to the data pad portion.

2. The display device of claim 1, wherein each subpixel comprises a light-emitting part and a driving part, and the organic light-emitting layer overlaps the entire light-emitting part.

3. The display device of claim 2, wherein the lines of the organic light-emitting layer are spaced apart from one another with gaps in between.

4. The display device of claim 3, wherein the gaps overlap only the driving parts of the subpixels.

5. The display device of claim 4, wherein at least one gap is positioned perpendicular to a long axis of the lines of the organic light-emitting layer.

6. The display device of claim 1, further comprising at least one organic film pattern positioned between two adjacent lines of the organic light-emitting layer,
wherein the organic film pattern is disposed parallel to the lines of the organic light-emitting layer.

7. The display device of claim 6, wherein the organic film pattern is spaced apart from the two adjacent lines of the organic light-emitting layer.

8. The display device of claim 1, wherein the display device is bendable in a direction perpendicular to a long axis of the data pad portion.

9. The display device of claim 1, wherein a long axis of the lines of the organic light-emitting layer is parallel to a long axis of the data pad portion.

10. The display device of claim 1, wherein the lines of the organic light-emitting layer are spaced apart from each other by a period of at least one subpixel arranged in a direction perpendicular to the long axis of the lines of the organic light-emitting layer.

11. The display device of claim 1, wherein the organic light-emitting diode emits white light.

12. A display device, comprising:
a plastic substrate including a display area and a non-display area outside the display area;
a data pad portion disposed in the non-display area, with a flexible circuit board bonded thereto; and
a plurality of subpixels positioned in the display area, the plurality of subpixels arranged in a plurality of lines of subpixels extending from a first side of the display area to a second side of the display area, each of the lines of subpixels including first subpixels having first color filters configured to emit light of a first color and second subpixels having second color filters configured to emit light of a second color that is different from the first color, each subpixel including an organic light-emitting diode that includes at least a portion of an organic light-emitting layer,
wherein the organic light-emitting layer includes a plurality of lines, each of the lines of the organic light-emitting layer extends continuously along a first direction from the first side of the display area to the second side and corresponds to a respective one of the plurality of lines of subpixels, the plurality of lines of the organic light-emitting layer being spaced apart from one another along a second direction that is transverse to the first direction and disposed parallel to the data pad portion, and
the light-emitting diode emits white light.

13. The display device of claim 12 wherein the first color filters and the second color filters convert the white light emitted from the organic light-emitting diode to the first color and the second color, respectively.

14. The display device of claim 1, wherein each of the lines of subpixels further includes a plurality of third subpixels configured to emit light of a third color that is different from the first color and the second color.

15. The display device of claim 14, wherein each of the lines of subpixels further includes a plurality of fourth subpixels configured to emit white light.

16. The display device of claim 15, wherein the first color is blue, the second color is green, and the third color is red.

17. The display device of claim 1, wherein each of the first subpixels of a first line of the subpixels is adjacent to a respective first subpixel of a second line of the subpixels along a second direction that is transverse to the first direction, and each of the second subpixels of the first line of the subpixels is adjacent to a respective second subpixel of the second line of the subpixels along the second direction.

18. The display device of claim 12, wherein each of the lines of subpixels further includes third subpixels having third color filters configured to emit light of a third color that is different from the first color and the second color.

* * * * *